(12) United States Patent
Bernard et al.

(10) Patent No.: US 6,465,867 B1
(45) Date of Patent: Oct. 15, 2002

(54) AMORPHOUS AND GRADATED BARRIER LAYER FOR INTEGRATED CIRCUIT INTERCONNECTS

(75) Inventors: Joffre F. Bernard, Redwood City, CA (US); Sergey D. Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/792,083

(22) Filed: Feb. 21, 2001

(51) Int. Cl.[7] ............................................. H01L 29/00
(52) U.S. Cl. ................. 257/520; 257/506; 257/508; 257/523; 257/652; 257/751; 257/761
(58) Field of Search ................. 257/520, 508, 257/652, 506, 523, 751, 753, 758, 761–764, 767–770

(56) References Cited

U.S. PATENT DOCUMENTS 6,057,237 A * 5/2000 Ding et al. ................. 438/687
6,136,682 A * 10/2000 Hegde et al. ................ 438/622
6,140,231 A * 10/2000 Lin et al. .................... 438/653
6,144,096 A * 11/2000 Lopatin ...................... 257/751
6,146,993 A * 11/2000 Brown et al. ............... 438/627
6,348,732 B1 * 2/2002 Lopatin et al. ............. 257/751

FOREIGN PATENT DOCUMENTS

EP         0881673 A2 * 12/1998

* cited by examiner

*Primary Examiner*—Nathan J. Flynn
*Assistant Examiner*—Remmon R. Fordé
(74) *Attorney, Agent, or Firm*—Mikio Ishimaru

(57) ABSTRACT

An integrated circuit and manufacturing method therefor is provided having a semiconductor substrate with a semiconductor device. A device dielectric layer is formed on the semiconductor substrate. A channel dielectric layer on the device dielectric layer has an opening formed therein. A barrier layer, which has been implanted with a compounding material, lines the channel opening. A conductor core fills the opening over the barrier layer. The barrier layer having a dielectric layer proximate portion of a barrier compound varying into a conductor core proximate portion of a pure barrier material.

10 Claims, 2 Drawing Sheets

AMORPHOUS AND GRADATED BARRIER LAYER FOR INTEGRATED CIRCUIT INTERCONNECTS

TECHNICAL FIELD

The present invention relates generally to semiconductor technology and more specifically to barrier layers in semiconductor devices and a manufacturing method therefor in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically for a single layer of interconnections, a "single damascen" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

A first major problem occurs with these barrier materials is that they are typically very high in resistance and reduce the advantage of using high conductivity materials, such as copper, which are desirable for high speed and good interconnections.

A second major problem occurs at the interface between the barrier and the conductor materials because the bonding is not very strong, and this permits atomic movement of conductor material, or electro-migration (EM), due to current flow to occur which results in void formation along the barrier layer and seed layer. This surface diffusion is particularly problematic with copper and causes these voids to occur in different locations, but most often in the vias and leads to open circuits.

A third major problem occurs at the interface between the barrier and the dielectric materials with particular reference to low dielectric constant (Low K) dielectric materials. Essentially, pure barrier materials have high conductivity but poor adhesion to Low K dielectric materials. Compounds of the barrier materials provide good adhesion to Low K dielectric materials but have much poorer conductivity.

A solution to this problem has been long sought but has long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A barrier layer lines the opening, and a conductor core fills the opening over the barrier layer. The barrier layer having a dielectric layer proximate portion of a barrier compound gradated into a conductor core proximate portion of a pure barrier material, which has an amorphized surface. The barrier layer has good adhesion to both Low K dielectric films and to conductor core materials while providing both a good barrier material and good electro-migration lifetime.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening and an ion implantation of the barrier layer is performed to have a dielectric layer proximate portion of a barrier compound gradated into a conductor core proximate portion of a pure barrier material. The ion implantation forms an amorphized surface on the surface of the barrier layer on the conductor core proximate portion. The conductor core is deposited to fill the channel opening over the barrier layer. The barrier layer having good adhesion to both Low K dielectric films and to conductor core materials while providing both a good barrier material and good electromigration lifetime.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
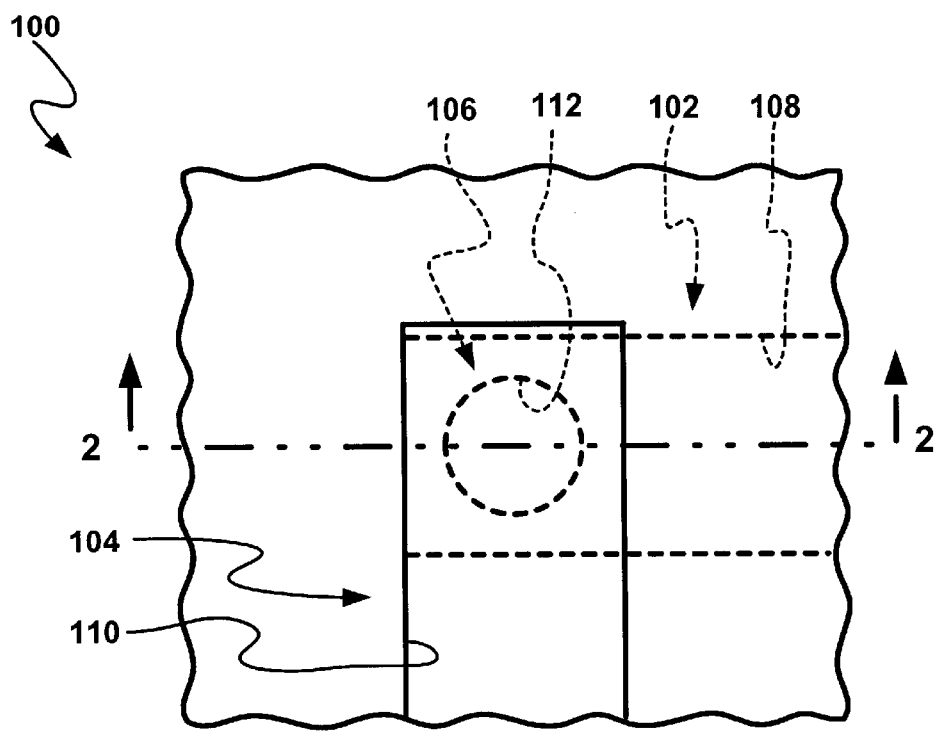
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
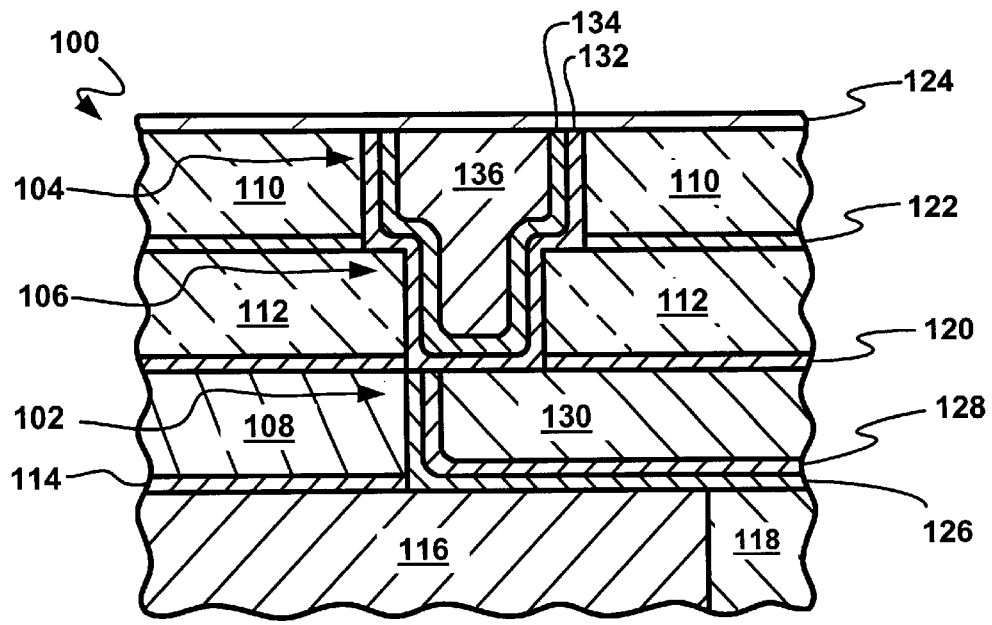
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, for copper conductor material and seed layers, highly resistive diffusion barrier materials such as tantalum nitride (TaN), titanium nitride (TiN), or tungsten nitride (WN) are used as barrier materials to prevent diffusion.

Also in the past, where barrier materials such as tantalum, titanium, and tungsten were used as barrier materials to prevent diffusion, there was poor bonding between the dielectric layers and the barrier material. In addition, the resistivity to diffusion was decreased.

Figure 3:
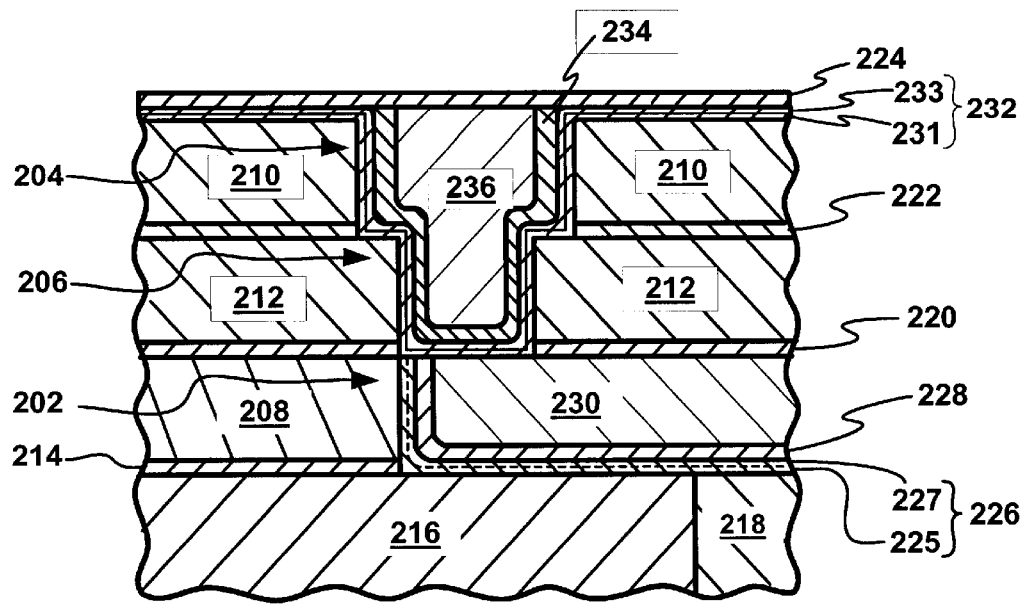
FIG. 3 is a cross-section, similar to FIG. 2 (PRIOR ART), of an interconnect in accordance with the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

In the present invention, the barrier layers 226 and 232 are processed so as to have varying compositions and characteristics from the portion adhering to the dielectric materials and the conductor materials. While graduated, the barrier layer 226 may be graduated as having a dielectric proximate portion 225 and a conductor proximate portion 227. Similarly, the barrier layer 232 has a dielectric proximate portion 231 and a conductor proximate portion 233.

Figure 4:
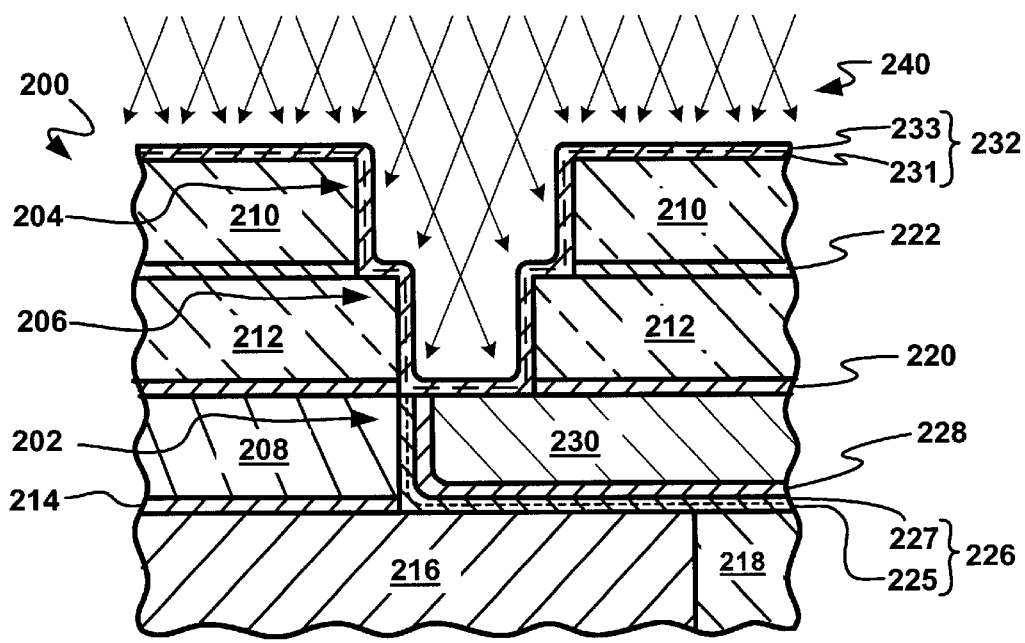
FIG. 4 is a cross-section of FIG. 3 during an intermediate stage of production in accordance with the present invention.

Referring now to FIG. 4, therein is shown an intermediate step in the manufacture of the structure of FIG. 3. After deposition of the barrier layer 232 and before deposition of the conductor core 236, the barrier layer 232 is subjected to an ion implantation 240. The ion implantation 240 implants a compounding material to form the dielectric proximate portion 231 while simultaneously amorphising the conductor proximate portion 233. The semiconductor wafer 200 can be rotated or the source can be rotated to assure proper implantation even at high aspect ratios of the vias.

In one embodiment, tantalum is deposited as the barrier layer 232 and the implant is performed by an ion implantation of nitrogen. The ion implantation 240 then converts the dielectric proximate portion 231 into tantalum nitride and/or a nitrogen-rich tantalum, which provides a fair barrier and has good adhesion to low dielectric constant (Low K) dielectric materials. The ion implantation 240 also amorphizes the tantalum, which improves its barrier characteristics, while providing a surface to which a conductor material such as copper can readily adhere. The good adhesion between copper and amorphized tantalum will also increase the diffusion resistance and thus increase the electro-migration lifetime.

The present invention essentially drives the nitride into the tantalum to form a high concentration of tantalum nitride and/or nitrogen-rich tantalum proximate the dielectric layer gradated toward the pure tantalum proximate the conductor core portion while at the same time amorphizing the surface of the tantalum to improve its adhesion characteristics with regard to the seed layer.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or Low K dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$), silicon oxynitride (SiON) or Low K materials such as silicon carbide (SiC) with dielectric constants below 5.5.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;
   a dielectric layer formed on the semiconductor substrate having an opening provided therein;
   a conductor core filling the opening and connected to the semiconductor device; and
   a barrier layer lining the opening, the barrier layer having a dielectric layer proximate portion of a barrier compound varying into a conductor core proximate portion of a pure barrier material, the conductor core proximate portion having an amorphized surface in contact with the conductor core.

2. The integrated circuit as claimed in claim 1 wherein the barrier compound contains a material selected from a group consisting of nitrogen, carbon, and a combination thereof.

3. The integrated circuit as claimed in claim 1 wherein the barrier material contains a metal selected from a group consisting of tantalum, titanium, tungsten, and a combination thereof.

4. The integrated circuit as claimed in claim 1 wherein the dielectric layer contains a low dielectric constant dielectric material.

5. The integrated circuit as claimed in claim 1 wherein the conductor core contains a material selected from a group consisting of copper, aluminum, gold, silver, a compound thereof, and a combination thereof.

6. An integrated circuit comprising:

a silicon substrate having a semiconductor device provided thereon;

a device dielectric layer formed on the silicon substrate;

a channel dielectric layer formed on the device dielectric layer having a channel opening provided therein;

a seed layer formed over the channel opening;

a conductor core filling the channel opening and connected to the semiconductor device, the conductor core over the seed layer; and a barrier layer lining the channel opening, the barrier layer having a channel dielectric layer proximate portion of a barrier compound varying into a conductor core proximate portion of a pure barrier material, the conductor core proximate portion having an amorphized surface in contact with the conductor core.

7. The integrated circuit as claimed in claim 6 wherein the barrier compound contains a material selected from a group consisting of nitrogen, carbon, and a combination thereof.

8. The integrated circuit as claimed in claim 6 wherein the barrier material contains a metal selected from a group consisting of tantalum, titanium, tungsten, and a combination thereof.

9. The integrated circuit as claimed in claim 6 wherein the channel dielectric layer contains a low dielectric constant dielectric material.

10. The integrated circuit as claimed in claim 6 wherein the seed layer and the conductor core contain materials selected from a group consisting of copper, gold, silver, a compound thereof, and a combination thereof.

* * * * *